United States Patent
Nangoh

(10) Patent No.: US 10,222,982 B2
(45) Date of Patent: Mar. 5, 2019

(54) LIFETIME MANAGEMENT DEVICE AND LIFETIME MANAGEMENT METHOD

(71) Applicant: Tomohiro Nangoh, Kanagawa (JP)

(72) Inventor: Tomohiro Nangoh, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 81 days.

(21) Appl. No.: 15/427,441

(22) Filed: Feb. 8, 2017

(65) Prior Publication Data
US 2017/0228161 A1    Aug. 10, 2017

(30) Foreign Application Priority Data

Feb. 10, 2016  (JP) .................................. 2016-023778
Nov. 22, 2016  (JP) .................................. 2016-226547

(51) Int. Cl.
| | |
|---|---|
| *G06F 3/06* | (2006.01) |
| *G11C 16/34* | (2006.01) |
| *G06F 11/00* | (2006.01) |
| *G11C 29/52* | (2006.01) |
| *G11C 29/44* | (2006.01) |

(52) U.S. Cl.
CPC ............ *G06F 3/0604* (2013.01); *G06F 3/064* (2013.01); *G06F 3/0616* (2013.01); *G06F 3/0653* (2013.01); *G06F 3/0679* (2013.01); *G06F 11/008* (2013.01); *G11C 16/3495* (2013.01); *G11C 29/52* (2013.01); *G11C 2029/4402* (2013.01)

(58) Field of Classification Search
CPC .................................. G06F 3/06; G06F 3/0604
USPC ......................................................... 714/47.3
See application file for complete search history.

(56) References Cited

U.S. PATENT DOCUMENTS

| | | | |
|---|---|---|---|
| 7,356,442 B1* | 4/2008 | Astigarraga | G06F 11/008 702/182 |
| 8,010,738 B1* | 8/2011 | Chilton | G11C 16/349 711/103 |
| 8,566,513 B2 | 10/2013 | Yamashita | |
| 2007/0283428 A1* | 12/2007 | Ma | G06F 11/1068 726/9 |
| 2008/0276016 A1* | 11/2008 | Fujibayashi | G06F 1/3221 710/36 |

(Continued)

FOREIGN PATENT DOCUMENTS

| | | |
|---|---|---|
| JP | 2012-088937 | 5/2012 |
| JP | 5593254 | 8/2014 |

*Primary Examiner* — Kamini B Patel
(74) *Attorney, Agent, or Firm* — Harness, Dickey & Pierce, P.L.C.

(57) ABSTRACT

A lifetime management device includes: a cumulative-written-amount calculation unit configured to, each time data is written to a first storage device, calculate a cumulative written amount, the cumulative written amount being a sum of amounts of data written to the first storage device; a first information recording unit configured to associate the cumulative written amount with identification information of the first storage device and usage-start date and time of the first storage device into an associated set and record the associated set in a second storage device; and an end-of-life prediction unit configured to predict end-of-life date and time of the first storage device based on the cumulative written amount and the usage-start date and time recorded in the second storage device.

20 Claims, 15 Drawing Sheets

(56) References Cited

U.S. PATENT DOCUMENTS

| | | | | |
|---|---|---|---|---|
| 2011/0173378 A1* | 7/2011 | Filor | ............... | G06F 11/004 |
| | | | | 711/103 |
| 2011/0276745 A1* | 11/2011 | Danilak | ............ | G06F 11/008 |
| | | | | 711/103 |
| 2011/0283053 A1* | 11/2011 | Yamashita | ........ | G06F 12/0246 |
| | | | | 711/103 |
| 2012/0185638 A1* | 7/2012 | Schreiber | ........ | G06F 17/30082 |
| | | | | 711/103 |
| 2015/0178000 A1* | 6/2015 | Yoon | ............... | G06F 3/0619 |
| | | | | 711/103 |
| 2017/0220268 A1* | 8/2017 | Guha | ............. | G06F 3/0616 |
| 2018/0060148 A1* | 3/2018 | Rudy | ............. | G06F 11/076 |

\* cited by examiner

|  | FAT12 | FAT16 | FAT32 |
|---|---|---|---|
| UNUSED CLUSTER | 0x000 | 0x0000 | 0x00000000 |
| RESERVED CLUSTER | 0x001 | 0x0001 | 0x00000001 |
| EFFECTIVE USER DATA CLUSTER | 0x002 TO 0xff6 | 0x0002 TO 0xfff6 | 0x00000002 TO 0xffffff6 |
| BAD CLUSTER | 0xff7 | 0xfff7 | 0xfffffff7 |
| LAST CLUSTER | 0xff8 TO 0xfff | 0xfff8 TO 0xffff | 0x0ffffff8 TO 0x0fffffff |

LIFETIME MANAGEMENT DEVICE AND LIFETIME MANAGEMENT METHOD

CROSS-REFERENCE TO RELATED APPLICATIONS

The present application claims priority under 35 U.S.C. § 119 to Japanese Patent Application No. 2016-023778, filed Feb. 10, 2016 and Japanese Patent Application No. 2016-226547, filed Nov. 22, 2016. The contents of which are incorporated herein by reference in their entirety.

BACKGROUND OF THE INVENTION

1. Field of the Invention

The present invention relates generally to lifetime management devices and lifetime management methods.

2. Description of the Related Art

Inexpensive large-capacity flash memories, in particular, NAND flash memories, are commonly used in image forming apparatuses, such as printers, copiers, and multifunction peripherals, as a memory for storing optional program codes (hereinafter, "optional program"), user data pertaining thereto, and the like.

A NAND flash memory has a physical limitation that the number of program/erase cycles (hereinafter, "P/E cycle count") per block is limited. When a P/E cycle count exceeds this limit, a read disturb error (i.e., a decrease in data retention capability) or a state (referred to as "bad block") where data cannot be written normally will occur. Accordingly, as the P/E cycle count increases, the NAND flash memory approaches a state where the NAND flash memory cannot be used normally or, in short, end of device life.

Because product useful life (product lifetime) of an image forming apparatus is relatively long, there can be a case where a memory for storing optional programs, user data, and the like reaches its end of life before the product reaches its end of life. In such a case, if a user continues using the product without noticing that the memory has reached its end of life, loss of the optional programs, user data, and the like can occur. Accordingly, it is desired to manage lifetime of the memory appropriately.

For SSDs (Solid State Drives), eMMCs (embedded MultiMedia Cards), and the like, a mechanism that informs a user of a P/E cycle count, the number of bad blocks, and the like using management information referred to as SMART (Self-Monitoring, Analysis and Reporting Technology) information and urges the user to make replacement or the like before the memory reaches its end of life as a device is provided. However, not all NAND flash memories have a mechanism that informs a user of management information, such as the SMART information. For example, as for USB (Universal Serial Bus) memories and SD cards, because management information is not defined in a standard, a user generally cannot obtain such information, e.g., the P/E cycle count and the number of bad block described above.

Japanese Unexamined Patent Application Publication No. 2012-088937 (Patent Document 1) describes a technique that, when a bad block occurs during data writing to a NAND flash memory, acquires bad-block-occurrence-related information pertaining to occurrence of the bad block and stores the information in a non-volatile storage. According to the technique described in Patent Document 1, a flag indicating that the NAND flash memory is unrecyclable is stored in the non-volatile storage when the number of bad blocks in the NAND flash memory exceeds a tolerance or when bad blocks occur at intervals shorter than a tolerance, so that whether or not the NAND flash memory is recyclable can be distinguished.

However, although the technique described in Patent Document 1 enables distinguishing whether or not the NAND flash memory is recyclable, the technique does not tell when the NAND flash memory will reach its end of life. Accordingly, there is room for improvement in terms of appropriate management of the NAND flash memory.

SUMMARY OF THE INVENTION

According to exemplary embodiments of the present invention, there is provided a lifetime management device comprising: a cumulative-written-amount calculation unit configured to, each time data is written to a first storage device, calculate a cumulative written amount, the cumulative written amount being a sum of amounts of data written to the first storage device; a first information recording unit configured to associate the cumulative written amount with identification information of the first storage device and usage-start date and time of the first storage device into an associated set and record the associated set in a second storage device; and an end-of-life prediction unit configured to predict end-of-life date and time of the first storage device based on the cumulative written amount and the usage-start date and time recorded in the second storage device.

Exemplary embodiments of the present invention also provide a lifetime management method comprising: calculating, each time data is written to a first storage device, a cumulative written amount, the cumulative written amount being a sum of amounts of data written to the first storage device; associating the cumulative written amount with identification information of the first storage device and usage-start date and time of the first storage device into an associated set and recording the associated set in a second storage device; and predicting end-of-life date and time of the first storage device based on the cumulative written amount and the usage-start date and time recorded in the second storage device.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
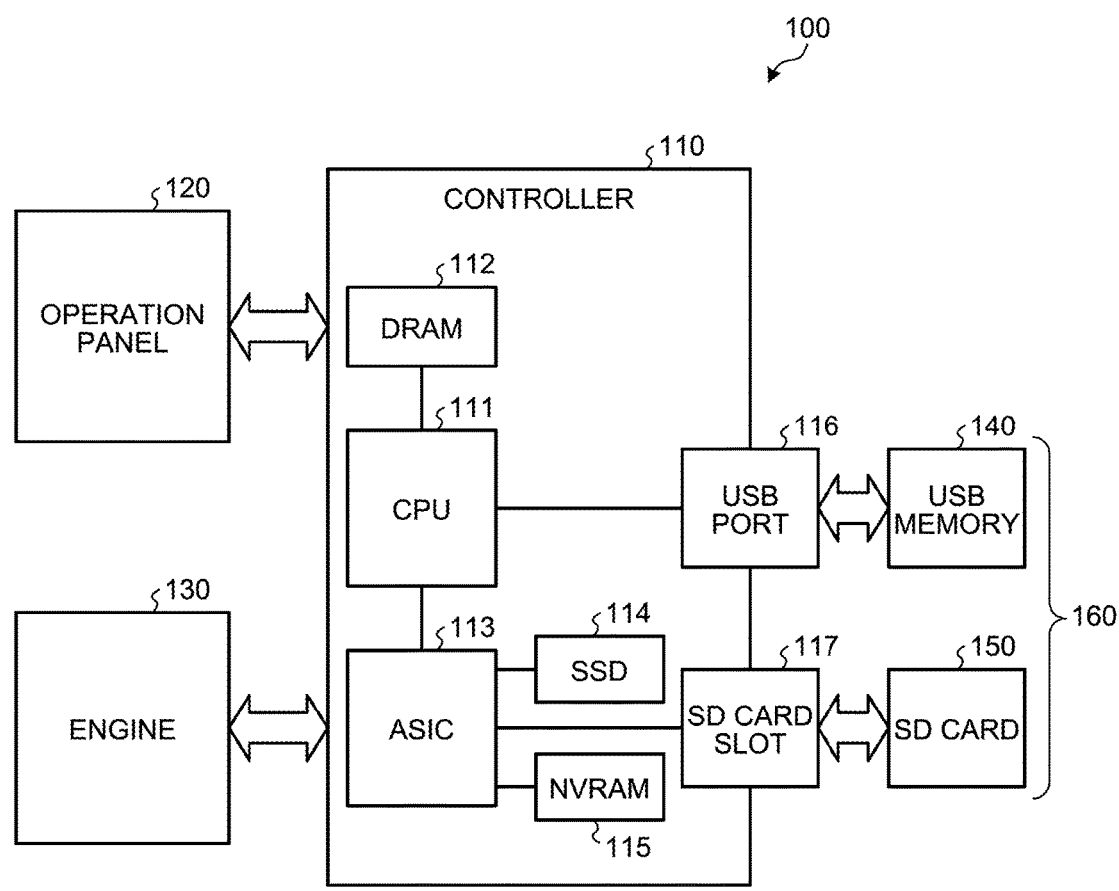
FIG. 1 is a block diagram illustrating an example hardware configuration of an image forming apparatus of a first embodiment.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

Preferred specific embodiments of the present invention are described in detail below with reference to the accompanying drawings. The embodiments described below are examples, in each of which a lifetime management device and a lifetime management method according to an aspect of the present invention are implemented as one function of an image forming apparatus (an implementation example of "equipment"). Note that the present invention is not limited to these examples; the present invention can alternatively be implemented as a function of equipment other than an image forming apparatus or as a device independent of the equipment.

First Embodiment

FIG. 1 is a block diagram illustrating an example hardware configuration of an image forming apparatus 100 of a first embodiment. The image forming apparatus 100 of the first embodiment includes a controller 110, an operation panel 120, and an engine 130, for example, as illustrated in FIG. 1.

The controller 110 is a control device that controls operations of the image forming apparatus 100. The controller 110 is configured by, for example, mounting various electronic components, such as a CPU (Central Processing Unit) 111, a DRAM (Dynamic Random Access Memory) 112, an ASIC (Application Specific Integrated Circuit) 113, an SSD 114, an NVRAM (Non-Volatile Random Access Memory) 115, a USB port 116, and an SD card slot 117, on a control wiring board. A USB memory 140 is to be plugged into the USB port 116. An SD card 150 is to be plugged into the SD card slot 117.

The CPU 111 is a computing unit that executes various programs for controlling operations of the image forming apparatus 100. The DRAM 112 is a memory for use as a working area when the CPU 111 executes a program, for example. The ASIC 113 is an integrated circuit for performing a variety of image processing and implementing various input/output interface functions. The SSD 114 stores a system's startup program, for example. The NVRAM 115 is a non-volatile memory having virtually unlimited program/erase cycle endurance. The NVRAM 115 stores a variety of data that needs to be recorded even after power supply to the image forming apparatus 100 is turned off. In the first embodiment, each of a cumulative written amount of the USB memory 140 and that of the SD card 150 is associated with identification information (device ID) of a corresponding one of the USB memory 140 and the SD card 150 and usage-start date into an associated set and recorded in the NVRAM 115.

The USB port 116 is an interface for connecting the USB memory 140 to the controller 110. The USB memory 140 is a memory to be used by a user as desired and is a flash memory externally connected to the image forming apparatus 100. The SD card slot 117 is an interface for connecting the SD card 150 to the controller 110. The SD card 150 is a memory for storing an optional program(s) and the like and is a flash memory externally connected to the image forming apparatus 100. Hereinafter, a term "external memory 160" is used to representatively denote each of the USB memory 140 and the SD card 150 externally connected to the image forming apparatus 100.

The operation panel 120 is a user interface for, under control of the controller 110, displaying a variety of information to inform a user thereof, and accepting various inputs entered through operations by a user and transmitting the inputs to the controller 110. The engine 130 includes a scanner engine that reads in an image of an original document under control of the controller 110 and a plotter engine that forms an image on recording paper or the like under control of the controller 110.

In the first embodiment, the external memory 160 (the USB memory 140, the SD card 150), which is a flash memory externally connected to the image forming apparatus 100, corresponds to "first storage device"; the NVRAM 115, which is a non-volatile memory having virtually unlimited program/erase cycle endurance, mounted on the image forming apparatus 100 corresponds to "second storage device". The image forming apparatus 100 of the first embodiment has a function as a lifetime management device that, each time data is written to the external memory 160, calculates a sum of amounts of data written to the external memory 160 (hereinafter, "cumulative written amount of the external memory 160"), and records the cumulative written amount in the NVRAM 115, and predicts end-of-life date and time when the cumulative written amount of the external memory 160 will reach a predetermined amount.

Figure 2:
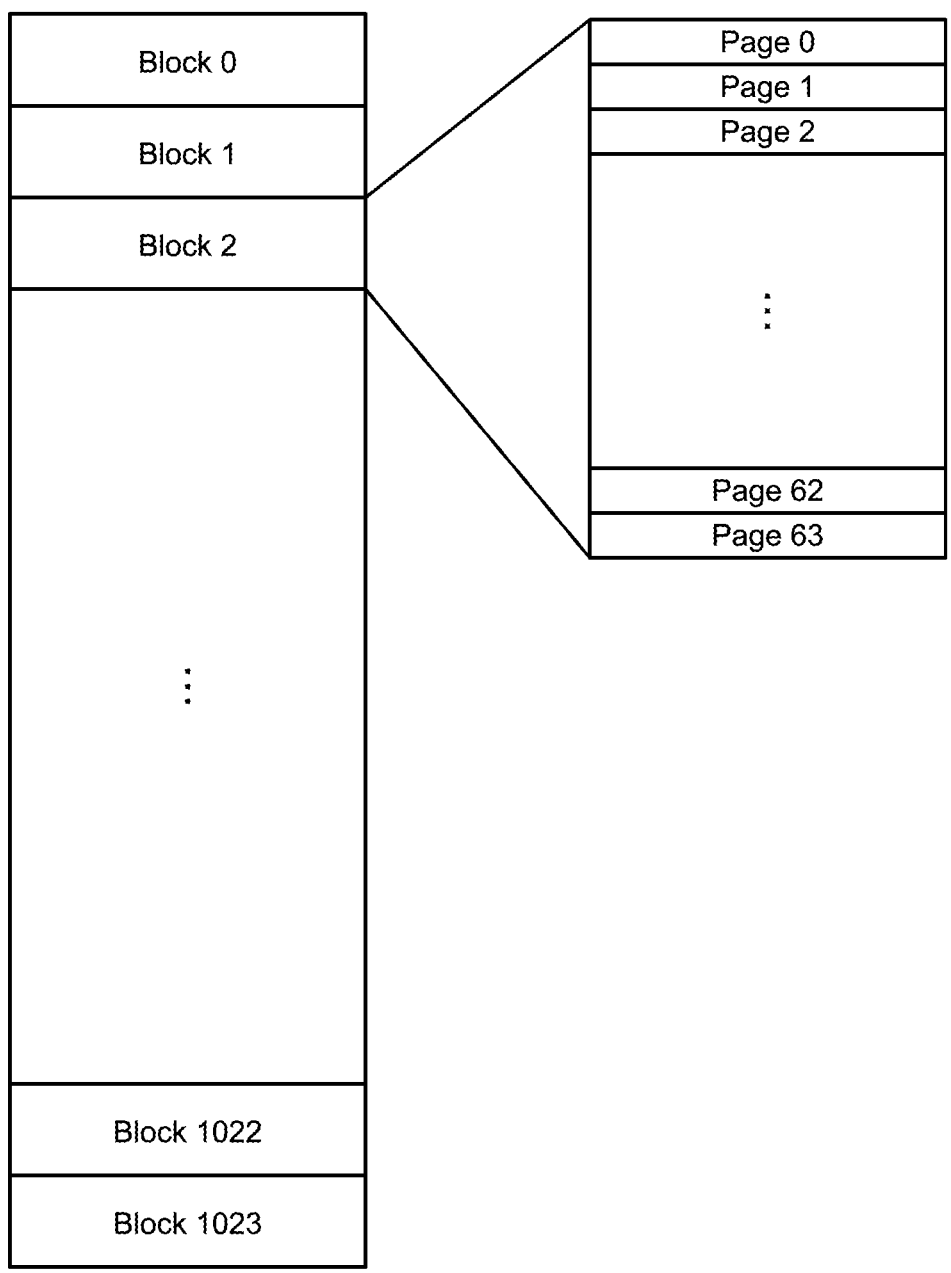
FIG. 2 is a diagram illustrating an internal architecture of a flash memory.

FIG. 2 is a diagram illustrating an internal architecture of a flash memory. As illustrated in FIG. 2, storage area in a flash memory is divided into a plurality of blocks (in the example of FIG. 2, Block0 to Block1023), and each block is made up of a plurality of pages (in the example of FIG. 2, page0 to page63). Although data is written to the flash memory in pages, data is erased in blocks. Existing data in the flash memory cannot be overwritten. Writing new data to a block where data is written is possible only after erasing the data from the block.

Writing and reading data to and from the flash memory are performed by a device driver, which is software running on an OS (operating system). In the image forming apparatus 100 of the first embodiment, for example, the CPU 111 of the controller 110 causes a device driver associated with the USB memory 140 to operate on the OS, thereby writing and reading data to and from the USB memory 140 plugged into the USB port 116. The CPU 111 of the controller 110 causes a device driver associated with the SD card 150 to operate on the OS, thereby writing and reading data to and from the SD card 150 plugged into the SD card slot 117.

Figure 3:
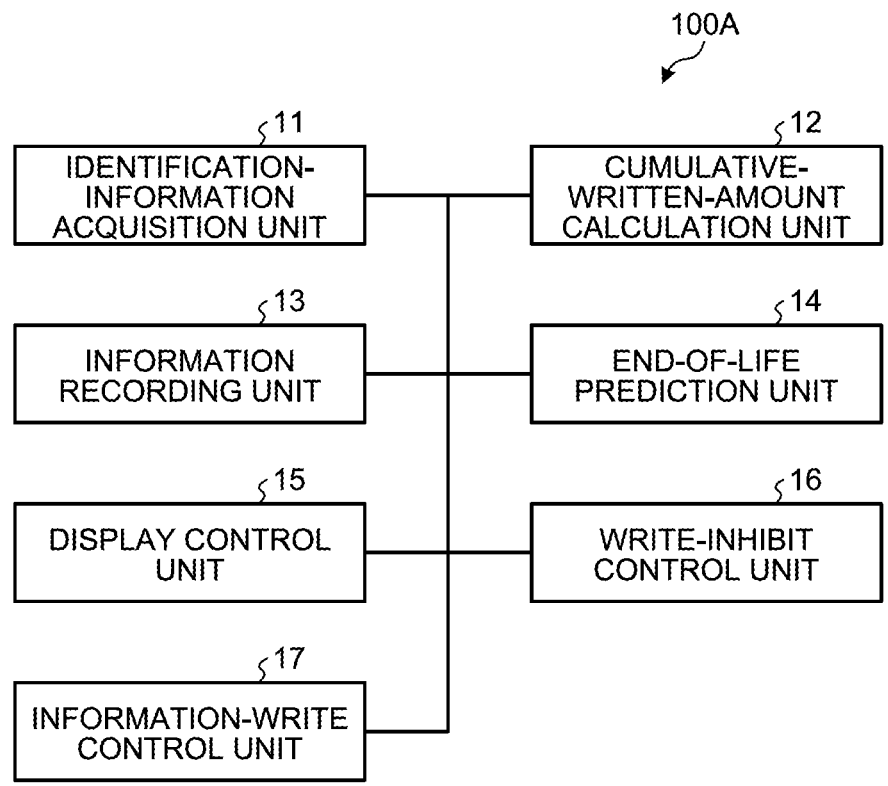
FIG. 3 is a block diagram illustrating an example functional configuration of a lifetime management device implemented as one function of the image forming apparatus.

FIG. 3 is a block diagram illustrating an example functional configuration of a lifetime management device 100A implemented as one function of the image forming apparatus 100 of the first embodiment. In the image forming apparatus 100 of the first embodiment, for example, the CPU 111 of the controller 110 executes a predetermined program where a procedure for performing a lifetime management method is described as program codes, thereby implementing functional elements making up the lifetime management device 100A. The functional elements include, as illustrated in FIG. 3, an identification-information acquisition unit 11, a cumulative-written-amount calculation unit 12, an information recording unit 13 (corresponding to "first information recording unit"), an end-of-life prediction unit 14, a display control unit 15, a write-inhibit control unit 16 (corresponding to "first write-inhibit control unit"), and an information-write control unit 17 (corresponding to "first information-write control unit").

The identification-information acquisition unit 11 is a functional module that, when the external memory 160 is connected to the image forming apparatus 100, acquires identification information (device ID) of the external memory 160. When the external memory 160 connected to the image forming apparatus 100 holds its unique device ID, the identification-information acquisition unit 11 acquires the device ID of the external memory 160 by reading out the device ID from the external memory 160. On the other hand, when the external memory 160 connected to the image forming apparatus 100 does not hold its unique device ID, the identification-information acquisition unit 11 generates the device ID of the external memory 160 based on current time or, in other words, time of an instant when the external memory 160 is connected to the image forming apparatus 100, or the like. In this case, the identification-information acquisition unit 11 writes the generated device ID to the external memory 160 via a corresponding device driver.

The cumulative-written-amount calculation unit 12 is a functional module that, each time data is written to the external memory 160, calculates a cumulative written amount of the external memory 160. When data is written to the external memory 160 by the device driver, the cumulative-written-amount calculation unit 12 counts an amount of the data written to the external memory 160. The cumulative-written-amount calculation unit 12 accesses the NVRAM 115 and, when a cumulative written amount associated with the device ID acquired by the identification-information acquisition unit 11 is recorded in the NVRAM 115, adds the newly-counted written amount to the cumulative written amount recorded in the NVRAM 115, thereby calculating an updated cumulative written amount. When a cumulative written amount associated with the device ID acquired by the identification-information acquisition unit 11 is not recorded in the NVRAM 115, the newly-counted written amount is used as it is as the cumulative written amount.

The information recording unit 13 is a functional module that associates the cumulative written amount calculated by the cumulative-written-amount calculation unit 12 with the device ID of the external memory 160 acquired by the identification-information acquisition unit 11 and usage-start date and time of the external memory 160 into an associated set and stores the associated set in the NVRAM 115. The information recording unit 13 accesses the NVRAM 115 and, when a cumulative written amount associated with the device ID acquired by the identification-information acquisition unit 11 is recorded in the NVRAM 115, updates the cumulative written amount recorded in the NVRAM 115 to the cumulative written amount newly calculated by the cumulative-written-amount calculation unit 12. On the other hand, when a cumulative written amount associated with the device ID acquired by the identification-information acquisition unit 11 is not recorded in the NVRAM 115, the information recording unit 13 sets, for example, current time or, in other words, time of an instant when the external memory 160 is connected to the image forming apparatus 100, as usage-start date and time, associates the device ID acquired by the identification-information acquisition unit 11, the usage-start date and time (the current time), and the cumulative written amount (i.e., the newly counted write amount) calculated by the cumulative-written-amount calculation unit 12 into an associated set, and stores the associated set in the NVRAM 115.

Figure 4:
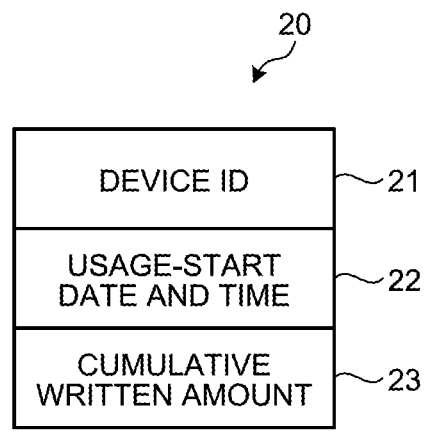
FIG. 4 is a diagram illustrating an example of per-external-memory information recorded in an NVRAM.

FIG. 4 is a diagram illustrating an example of information recorded in the NVRAM 115 on a per-memory basis of the external memory 160. As illustrated in FIG. 4, for example, as information 20, which is recorded for each of the external memory 160, information 21 indicating the device ID of the external memory 160, information 22 indicating usage-start date and time of the external memory 160, and information 23 indicating a cumulative written amount of the external memory 160 are associated with each other and recorded in the NVRAM 115.

When a cumulative written amount associated with the device ID acquired by the identification-information acquisition unit 11 is not recorded in the NVRAM 115 and the external memory 160 holds usage-start date and time and a cumulative written amount, the information recording unit 13 associates the usage-start date and time and the cumulative written amount held by the external memory 160 with the device ID acquired by the identification-information acquisition unit 11 into an associated set and records the associated set in the NVRAM 115. Thus, inheriting information, which will be described later, at replacement of the image forming apparatus 100 is achieved.

The end-of-life prediction unit 14 is a functional module that predicts end-of-life date and time when the cumulative written amount of the external memory 160 will reach a predetermined amount based on the cumulative written amount and the usage-start date and time of the external memory 160 recorded in the NVRAM 115. The end-of-life prediction unit 14 may make the prediction at a predetermined time, e.g., at power-on of the image forming apparatus 100, at power-off of the image forming apparatus 100, when the external memory 160 is plugged into the image forming apparatus 100, when the external memory 160 is unplugged from the image forming apparatus 100, at a predetermined time of day, or at predetermined regular time intervals.

When the time for predicting end-of-life date and time comes, the end-of-life prediction unit 14 accesses the NVRAM 115 and reads out a cumulative written amount and usage-start date and time associated with the device ID of the external memory 160, which is a prediction subject or, more specifically, the external memory 160 connected to the image forming apparatus 100, from the NVRAM 115. When the cumulative written amount read out from the NVRAM 115 is already equal to or larger than the predetermined amount, the end-of-life prediction unit 14 determines that the external memory 160 has already reached its end of life. On the other hand, when the cumulative written amount read out from the NVRAM 115 is smaller than the predetermined amount, the end-of-life prediction unit 14 calculates elapsed time from when use of the external memory 160 is started based on the usage-start date and time read out from the NVRAM 115 and current time and divides the cumulative written amount read out from the NVRAM 115 by the elapsed time, thereby calculating an average written amount per unit time (e.g., per hour) of the external memory 160 first. The end-of-life prediction unit 14 predicts end-of-life date and time when the cumulative written amount of the external memory 160 will reach the predetermined amount by dividing the difference between the cumulative written amount and the predetermined amount by the average written amount per unit time.

As described above, end of life of the external memory 160 depends on the number of times when data is written to the external memory 160 (hereinafter, "write count of the external memory 160"). Because the first embodiment uses the cumulative written amount of the external memory 160, end of life of the external memory 160 is not always determined accurately. However, because the cumulative written amount of the external memory 160 is highly correlated with the write count, end of life of the external memory 160 can be predicted highly accurately based on the write count of the external memory 160.

The display control unit 15 is a functional module that performs a control operation that causes the end-of-life date and time predicted by the end-of-life prediction unit 14 to be displayed on the operation panel 120 (an implementation example of "display device"). The display control unit 15 causes the end-of-life date and time predicted by the end-of-life prediction unit 14 to be displayed on the operation panel 120 as a text data message, for example. The display control unit 15 may be configured to cause, in addition to the end-of-life date and time predicted by the end-of-life prediction unit 14, a warning message indicating that end of life of the external memory 160 is near to be displayed on the operation panel 120 when the end-of-life date and time predicted by the end-of-life prediction unit 14 is within a next predetermined period of time (e.g., within the next three months).

The display control unit 15 may be configured to cause an error message indicating that the external memory 160 is unavailable or the like to be displayed on the operation panel 120 when the end-of-life prediction unit 14 determines that the external memory 160 has already reached its end of life. The display control unit 15 may be configured to cause an error message indicating that the external memory 160 is unavailable or the like to be displayed on the operation panel 120 when the external memory 160 connected to the image forming apparatus 100 is placed in a write inhibit mode.

The write-inhibit control unit 16 is a functional module that performs a control operation that inhibits writing data to the external memory 160 whose cumulative written amount calculated by the cumulative-written-amount calculation unit 12 has reached the predetermined amount. The write-inhibit control unit 16 can inhibit writing data to the external memory 160 by, for example, placing the external memory 160 whose cumulative written amount calculated by the cumulative-written-amount calculation unit 12 has reached the predetermined amount or, in other words, the external memory 160 determined by the end-of-life prediction unit 14 as having already reached its end of life, in the write inhibit mode. Placing the external memory 160 in the write inhibit mode may be implemented by turning on a specific switch provided on the external memory 160 or, alternatively, by setting a specific flag determined in advance. The control operation that inhibits writing data to the external memory 160 may be implemented by setting the device driver associated with the external memory 160 in a write inhibit mode.

The information-write control unit 17 is a functional module that performs a control operation that causes the cumulative written amount and the usage-start date and time recorded in the NVRAM 115 to be written to the external memory 160 in response to a predetermined operation. In a situation where the image forming apparatus 100, which is an old one, is replaced with the image forming apparatus 100, which is a new one, a scenario where the same external memory 160 used with the old image forming apparatus 100 is to be used with the new image forming apparatus 100 can occur. In this scenario, it is desirable that the new image forming apparatus 100 inherits information including the cumulative written amount and the usage-start date and time of the external memory 160 recorded in the NVRAM 115 from the old image forming apparatus 100. To implement information inheritance at such replacement of the image forming apparatus 100, when a predetermined operation instructing to inherit information is performed by a user, the information-write control unit 17 performs a process of reading out the cumulative written amount and the usage-start date and time associated with the device ID of the external memory 160 connected to the image forming apparatus 100 from the NVRAM 115 and writing the cumulative written amount and the usage-start date and time to the external memory 160 via the device driver.

The cumulative written amount and the usage-start date and time written to the external memory 160 are held by the external memory 160. Thereafter, when the external memory 160 is connected to the new image forming apparatus 100, the cumulative written amount and the usage-start date and time are recorded in the NVRAM 115 of the new image forming apparatus 100 by the information recording unit 13 of the new image forming apparatus 100. Hence, information is inherited at replacement of the image forming apparatus 100.

Operations of the lifetime management device 100A configured as a combination of the above-described functional modules are described below with reference to FIG. 5 to FIG. 8.

Figure 5:
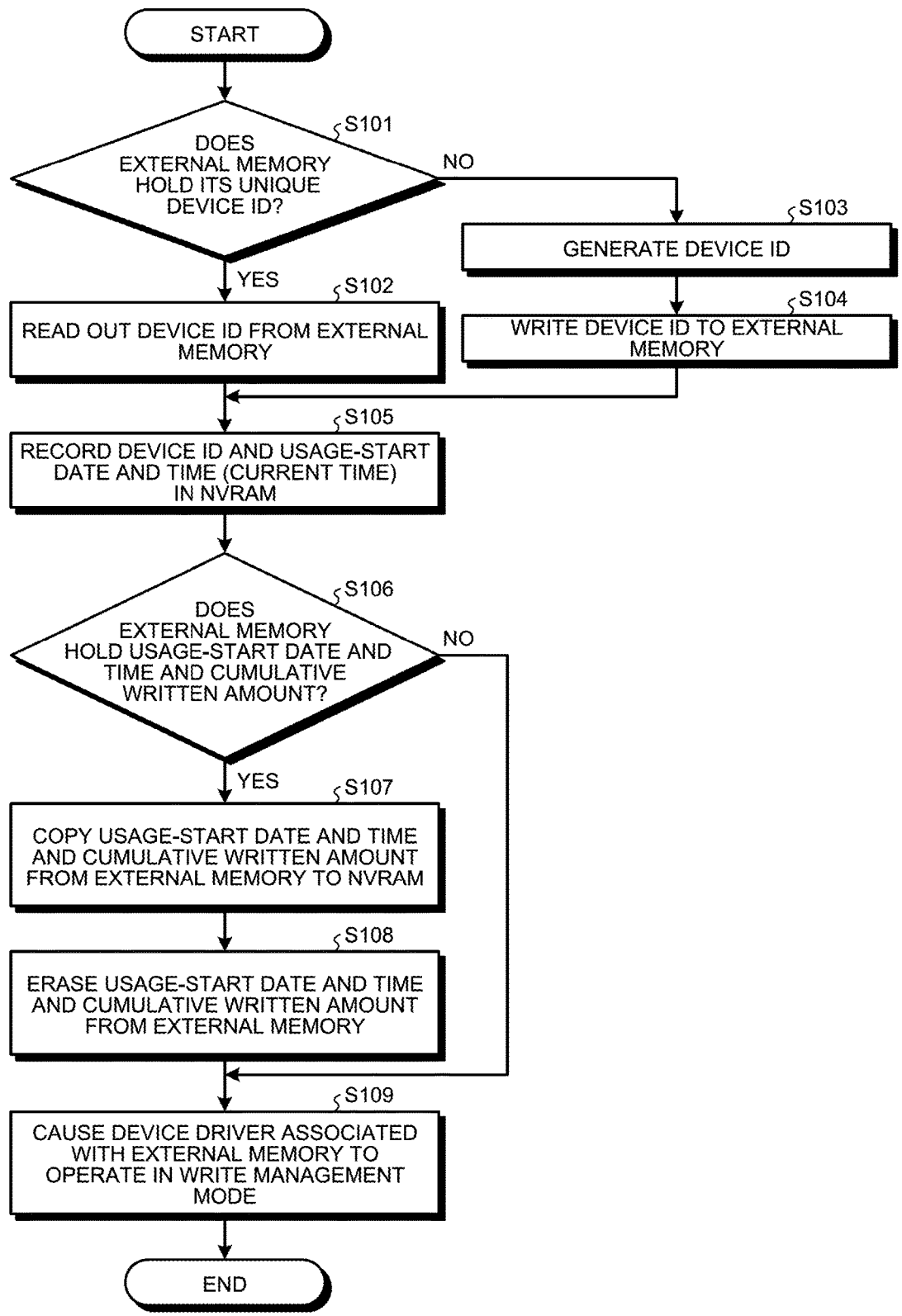
FIG. 5 is a flowchart illustrating an example of how the lifetime management device operates when an external memory is connected to the image forming apparatus.

FIG. 5 is a flowchart illustrating an example of how the lifetime management device 100A operates when the external memory 160 is connected to the image forming apparatus 100. The series of steps illustrated in the flowchart of FIG. 5 is executed each time it is detected that the external memory 160 is connected to the image forming apparatus 100.

When it is detected that the external memory 160 is connected to the image forming apparatus 100, the identification-information acquisition unit 11 determines whether or not the external memory 160 holds its unique device ID first (step S101). When the external memory 160 holds its unique device ID (Yes at step S101), the identification-information acquisition unit 11 reads out the device ID from the external memory 160 (step S102). On the other hand, when the external memory 160 does not hold its unique device ID (No at step S101), the identification-information acquisition unit 11 generates the device ID of the external memory 160 based on current time, for example (step S103), and writes the generated device ID to the external memory 160 (step S104).

Next, the information recording unit 13 determines that the current time is usage-start date and time of the external memory 160, and records the usage-start date and time (the current time) of the external memory 160 and any one of the device ID read out from the external memory 160 at S102 and the device ID generated at S103 in the NVRAM 115 (step S105). When the device ID and usage-start date and time of the external memory 160 have already been recorded in the NVRAM 115, processing at S105 is to be skipped.

Next, the information recording unit 13 determines whether or not the external memory 160 holds usage-start date and time and a cumulative written amount (step S106). When the external memory 160 holds usage-start date and time and a cumulative written amount (Yes at step S106), the information recording unit 13 copies the usage-start date and time and the cumulative written amount from the external memory 160 to the NVRAM 115 (step S107). Thereafter, the information recording unit 13 erases the usage-start date and time and the cumulative written amount from the external memory 160 (step S108). On the other hand, when the external memory 160 does not hold usage-start date and time and a cumulative written amount (No at step S106), processing at step S107 and step S108 is to be skipped.

Lastly, the cumulative-written-amount calculation unit 12 causes the device driver associated with the external memory 160 to operate in a write management mode (step S109). Then, the series of steps ends.

Figure 6:
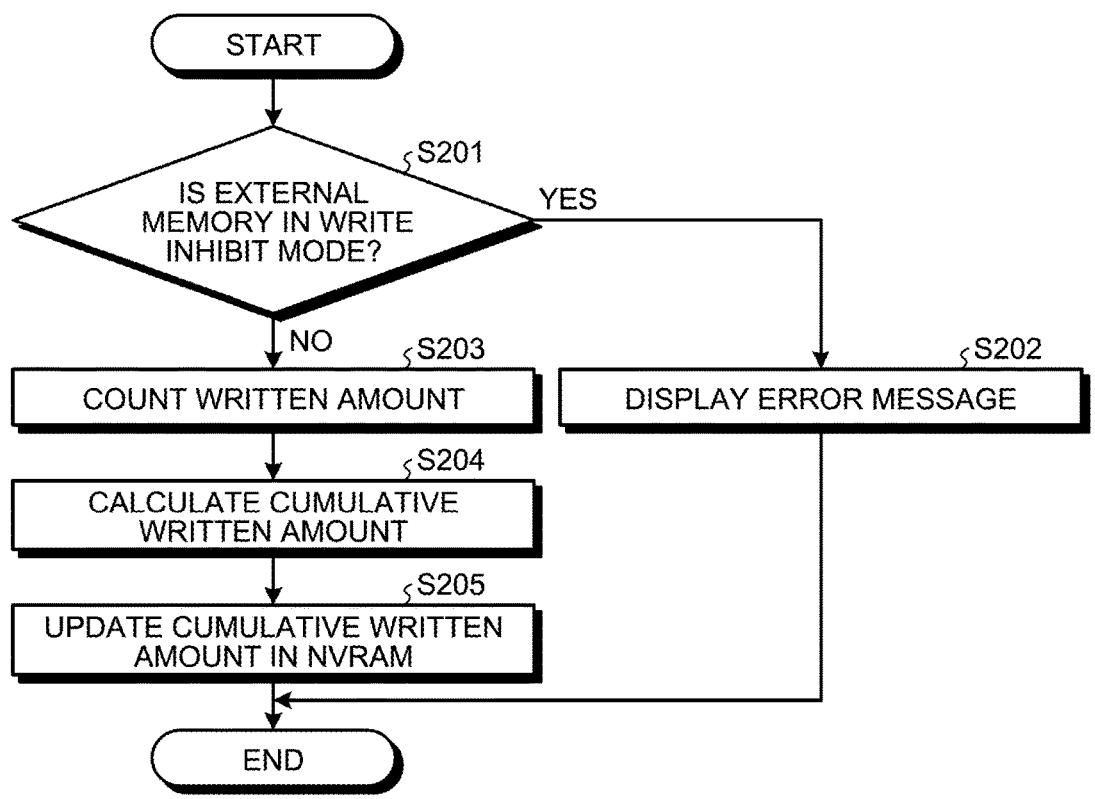
FIG. 6 is a flowchart illustrating an example of how the lifetime management device operates when data is written to the external memory.

FIG. 6 is a flowchart illustrating an example of how the lifetime management device 100A operates when data is written to the external memory 160. The series of steps illustrated in the flowchart of FIG. 6 is executed each time the device driver operating in the write management mode receives a write command.

When the device driver associated with the external memory 160 receives a write command, the display control unit 15 determines whether or not the external memory 160 is in the write inhibit mode first (step S201). When the external memory 160 is in the write inhibit mode (Yes at step S201), the display control unit 15 causes the error message indicating that the external memory 160 is unavailable or the like to be displayed on the operation panel 120 (step S202). Then, the series of steps ends.

On the other hand, when the external memory 160 is not in the write inhibit mode (No at step S201), the device driver writes data to the external memory 160. At this time, the cumulative-written-amount calculation unit 12 counts an amount of the data written by the device driver to the external memory 160 (step S203). The cumulative-written-amount calculation unit 12 adds the written amount counted at step S203 to the cumulative written amount recorded in the NVRAM 115, thereby calculating a cumulative written amount of the external memory 160 that is increased by the newly written data (step S204). The information recording unit 13 updates the cumulative written amount recorded in the NVRAM 115 with the cumulative written amount calculated at step S204 (step S205). Then, the series of steps ends.

When a cumulative written amount of the external memory 160 is not recorded in the NVRAM 115 when data is written to the external memory 160, the written amount counted by the cumulative-written-amount calculation unit 12 at S203 is used as the cumulative written amount of the external memory 160. In this case, the information recording unit 13 records the written amount counted at S203 as the cumulative written amount of the external memory 160 in the NVRAM 115.

Figure 7:
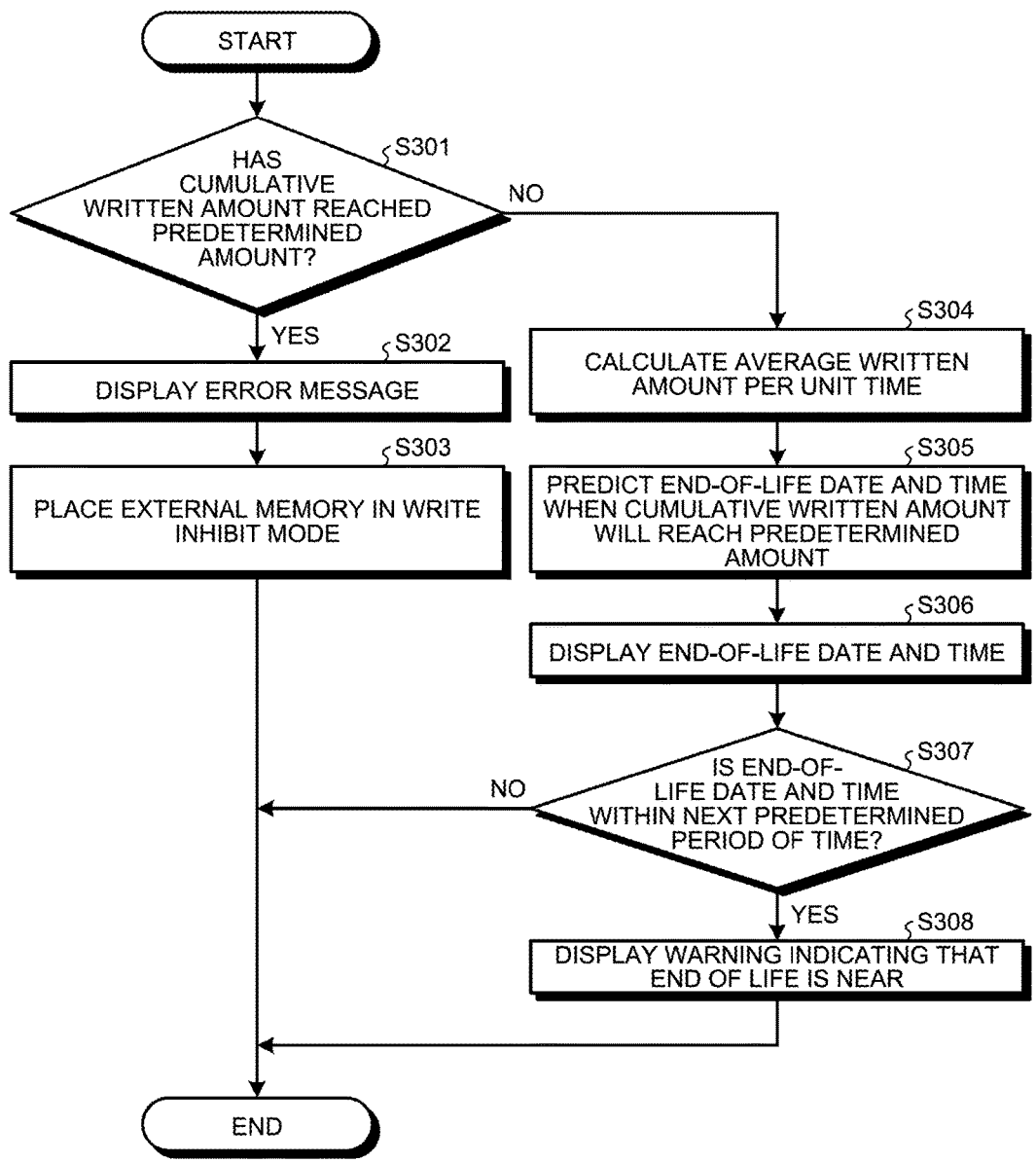
FIG. 7 is a flowchart illustrating an example of how the lifetime management device operates when the time for predicting end-of-life date and time comes.

FIG. 7 is a flowchart illustrating an example of how the lifetime management device 100A operates when the time for predicting end-of-life date and time comes. The series of steps illustrated in the flowchart of FIG. 7 is executed each time when a specific time determined in advance as the time for predicting end-of-life date and time comes.

When the time for predicting end-of-life date and time comes, the end-of-life prediction unit 14 accesses the NVRAM 115 to determine whether or not the cumulative written amount of the external memory 160 connected to the image forming apparatus 100 has reached the predetermined amount (step S301). When the cumulative written amount of the external memory 160 has reached the predetermined amount (Yes at step S301), the display control unit 15 causes the error message indicating that the external memory 160 is unavailable or the like to be displayed on the operation panel 120 (step S302). The write-inhibit control unit 16 places the external memory 160 in the write inhibit mode (step S303). Then, the series of steps ends.

On the other hand, when the cumulative written amount of the external memory 160 has not reached the predetermined amount (No at step S301), the end-of-life prediction unit 14 calculates an average written amount per unit time of the external memory 160 based on the usage-start date and time of the external memory 160, current time, and the cumulative written amount (step S304). The end-of-life prediction unit 14 predicts end-of-life date and time when the cumulative written amount of the external memory 160 will reach the predetermined amount by dividing the difference between the cumulative written amount and the predetermined amount by the average written amount per unit time calculated at step S304 (step S305).

Next, the display control unit 15 causes the end-of-life date and time of the external memory 160 predicted at S305 to be displayed on the operation panel 120 (step S306). The display control unit 15 determines whether or not the end-of-life date and time of the external memory 160 predicted at S305 is within the next predetermined period of time (e.g., within the next three months) (step S307). When the end-of-life date and time of the external memory 160 is within the next predetermined period of time (Yes at step S307), the display control unit 15 causes the warning message indicating that end of life of the external memory 160 is near to be displayed on the operation panel 120 (step S308). Then, the series of steps ends. When the end-of-life date and time of the external memory 160 is not within the next predetermined period of time (No at step S307), only displaying the end-of-life date and time of step S306 is performed.

Figure 8:
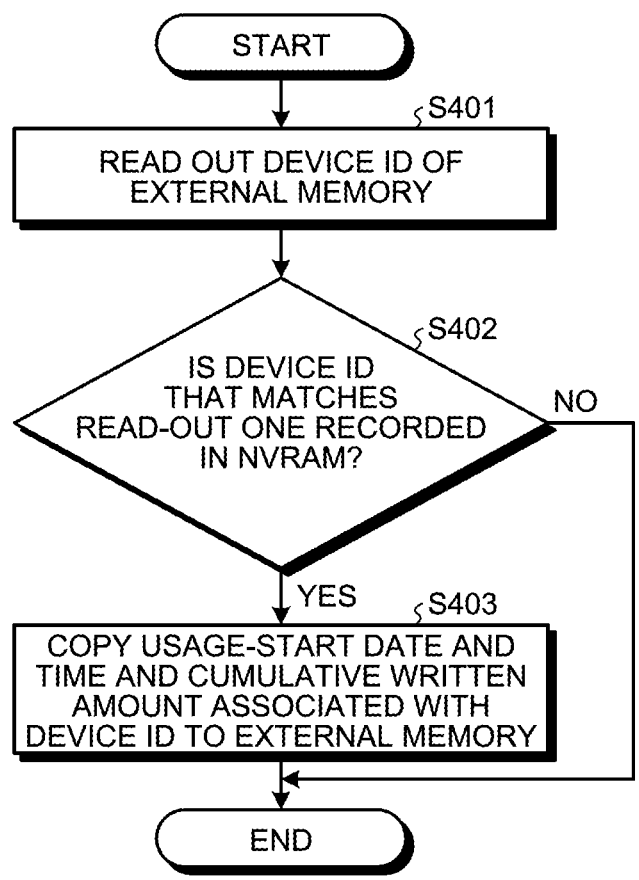
FIG. 8 is a flowchart illustrating an example of how the lifetime management device operates when a predetermined operation instructing to inherit information is performed.

FIG. 8 is a flowchart illustrating an example of how the lifetime management device 100A operates when the predetermined operation instructing to inherit information is performed. The series of steps illustrated in the flowchart of FIG. 8 is executed each time the predetermined operation instructing to inherit information is detected.

When the predetermined operation instructing to inherit information is detected, the information-write control unit 17 reads out the device ID from the external memory 160 connected to the image forming apparatus 100 (step S401). The information-write control unit 17 accesses the NVRAM 115 to determine whether or not the device ID that matches the device ID read out at step S401 is recorded in the NVRAM 115 (step S402). When the device ID that matches the device ID read out at step S401 is not recorded in the NVRAM 115 (No at step S402), the series of steps ends.

On the other hand, when the device ID that matches the one read out at step S401 is recorded in the NVRAM 115 (Yes at step S402), the information-write control unit 17 copies usage-start date and time and a cumulative written amount recorded in the NVRAM 115 and associated with the device ID to the external memory 160 (step S403). Then, the series of steps ends.

As described above in detail through specific examples, the lifetime management device 100A of the first embodiment is configured such that, each time data is written to the external memory 160 connected to the image forming apparatus 100, the cumulative-written-amount calculation unit 12 calculates a cumulative written amount of the external memory 160, and the information recording unit 13 associates the cumulative written amount of the external memory 160 with the device ID and usage-start date and time of the external memory 160 into an associated set and stores the associated set in the NVRAM 115. The end-of-life prediction unit 14 predicts end-of-life date and time of the external memory 160 or, more specifically, end-of-life date and time when the cumulative written amount of the external memory 160 will reach the predetermined amount, based on the cumulative written amount and the usage-start date and time recorded in the NVRAM 115. Thus, the lifetime management device 100A of the first embodiment is configured to be capable of predicting end-of-life date and time when the cumulative written amount of the external memory 160 will reach the predetermined amount. Accordingly, the lifetime management device 100A can manage lifetime of the external memory 160 appropriately.

The lifetime management device 100A of the first embodiment is configured such that, when the external memory 160 holds its unique device ID, the identification-information acquisition unit 11 reads out the device ID; but when the external memory 160 does not hold its unique device ID, the identification-information acquisition unit 11 generates the device ID and writes the device ID to the external memory 160. Accordingly, the device ID of the external memory 160 can be acquired appropriately. Furthermore, an increase in write amount, which would otherwise occur if the device ID is written to the external memory 160 where the device ID is already held, can be reduced effectively.

The lifetime management device 100A of the first embodiment is configured such that, when the cumulative written amount of the external memory 160 has reached the predetermined amount, the write-inhibit control unit 16 performs the control operation that inhibits writing data to the external memory 160. Accordingly, occurrence of an undesirable situation that writing data to the external memory 160 that has reached its end of life results in loss of existing data stored in the external memory 160 can be effectively reduced.

The lifetime management device 100A of the first embodiment is configured such that, when the predetermined operation instructing to inherit information is performed, the information-write control unit 17 performs the control operation that writes a cumulative written amount and usage-start date and time of the external memory 160 recorded in the NVRAM 115 to the external memory 160. Accordingly, the information can be inherited appropriately at replacement of the image forming apparatus 100.

The lifetime management device 100A of the first embodiment is configured such that the display control unit 15 performs the control operation that causes end-of-life date and time predicted by the end-of-life prediction unit 14 to be displayed on the operation panel 120. Accordingly, it is possible to inform a user when to replace the external memory 160, thereby urging the user to prepare for replacement of the external memory 160.

Second Embodiment

In a second embodiment, as an index for determining end of life of the external memory 160, not only the above-described cumulative written amount but also per-cluster write counts managed on a file system associated with the external memory 160 are used. Specifically, the per-cluster write counts are recorded in the DRAM 112 (corresponding to "third storage device") or the like. Each cluster whose write count has reached a predetermined count is marked as a bad cluster. When the number of bad clusters has exceeded a predetermined number, it is determined that the external memory 160 has reached its end of life, and writing data to the external memory 160 is inhibited. When the number of the bad clusters is equal to or smaller than the predetermined number, end-of-life date and time when the external memory 160 will reach its end of life is predicted by using a method similar to that of the above-described first embodiment or by using a sum total (hereinafter, "total write count") of the per-cluster write counts recorded in the DRAM 112 or the like. Hereinafter, elements similar to those of the first embodiment are denoted by like reference numerals and repeated description is omitted as appropriate; only portions that differ from the first embodiment are described.

A FAT file system, which is a file system provided for the external memory 160, such as the USB memory 140 and the SD card 150, is a system that manages user data in clusters and records mapping information pertaining thereto in a management table generally referred to as FAT (File Allocation Table).

Figure 9:
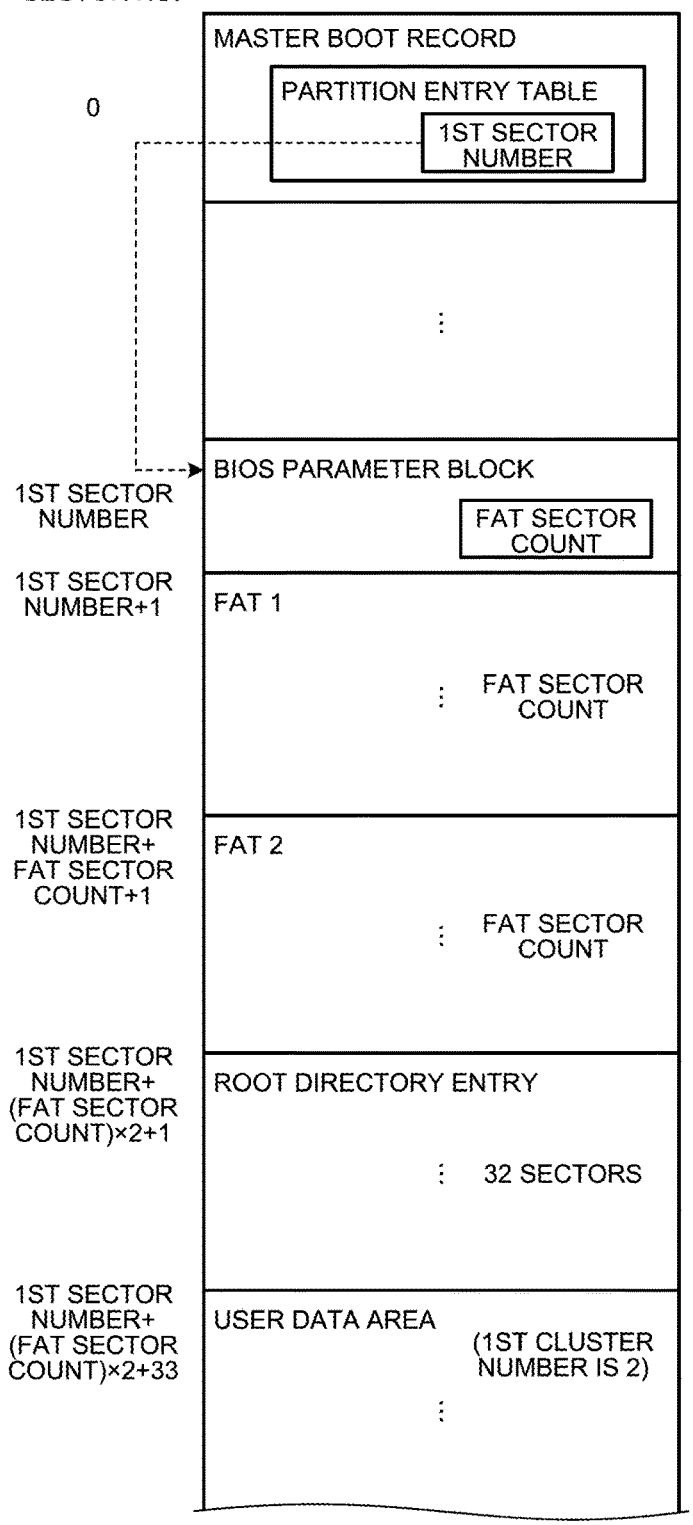
FIG. 9 is a diagram describing an overview of a FAT file system.

FIG. 9 is a diagram describing an overview of the FAT file system. The smallest units, in which data is written on the FAT file system, are called sectors. Information referred to as a master boot record is stored in the beginning sector. The master boot record is information about an entire disk (in the present example, the external memory 160, such as the USB memory 140 and the SD card 150) including information (partition entry table) about partitions. The partitions are the units, into which the disk is partitioned for divided use.

An area from the sector next to the beginning sector to the 19th sector is taken up as a free area, and the disk is partitioned from the 20th sector. The 1st sector in the partitioned area is a boot sector, where a BIOS parameter block and the like are contained. Information about an internal structure of the partitions, such as the numbers of sectors on the partitions, the number of sectors in a single cluster, and the number of sectors in a single FAT, is stored in the BIOS parameter block. A cluster is a group of a plurality of sectors. User data is written on a per-cluster basis.

The partitioned area includes a data area that is generally used on partitions following the boot sector including the BIOS parameter block. The data area includes two FATs, which are FAT1 and FAT2, a root directory entry, and a user data area where user data is to be actually written.

An FAT is a table where information about status of each cluster and information about which is the next cluster in a cluster chain in the user data area is stored as a one-dimensional array. Same values are stored in FAT1 and FAT2; accordingly, FAT2 is a mirror of FAT1. User data is written to free clusters. In response to writing of user data, FAT2, for example, is updated first. After the user data has been written, content of FAT2 is copied to FAT1. Hence, the process of writing the user data is completed.

Figures 10, 11:
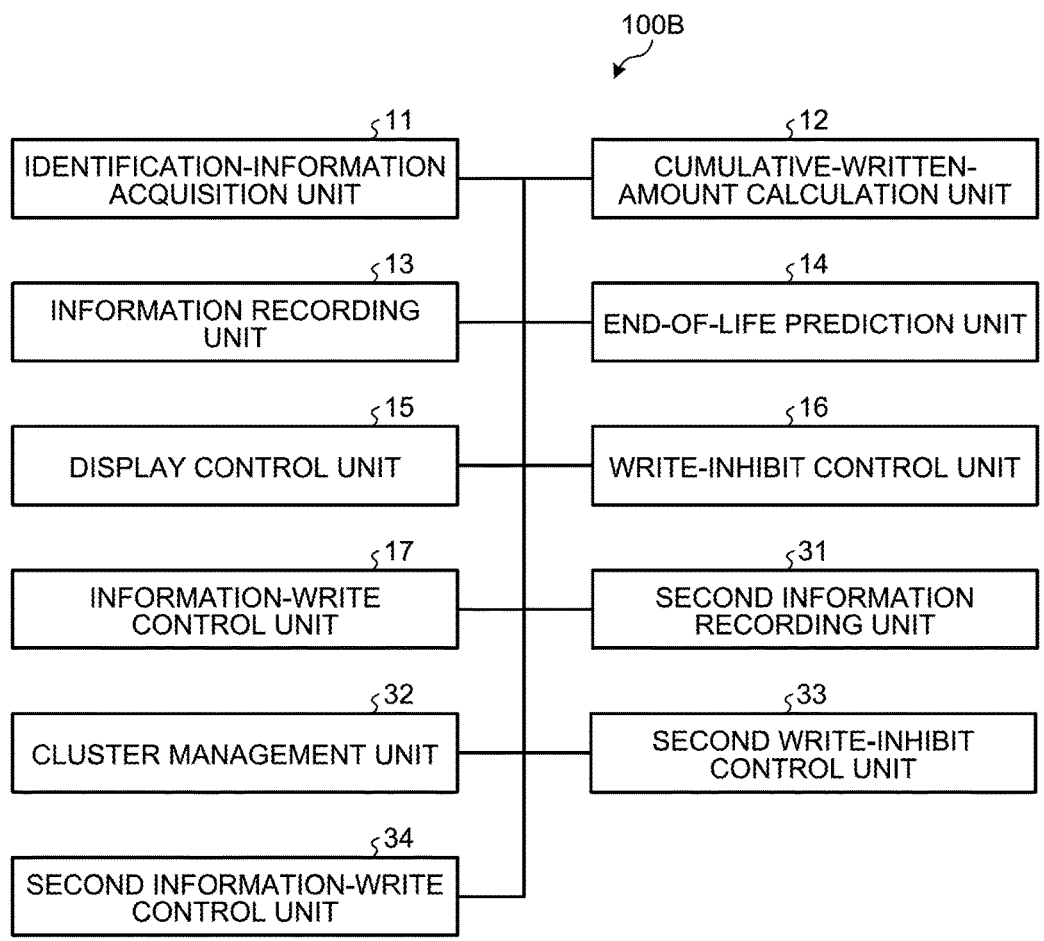
FIG. 10 is a diagram describing cluster identifiers in FATs.
FIG. 11 is a block diagram illustrating an example functional configuration of a lifetime management device of a second embodiment.

FIG. 10 is a diagram describing cluster identifiers in FATs. FAT12, FAT16, and FAT32 in FIG. 10 are types classified by the number of bits used in the corresponding cluster identifier. Clusters (an unused cluster and an effective user data cluster) usable by a user, a reserved cluster unusable by a user, a bad cluster indicating a broken cluster, and a last cluster indicating the end of a cluster chain are provided for the FATs. Each cluster is identified by a corresponding one of the cluster identifiers presented in FIG. 10.

The root directory entry is an area where directory information about a file is stored. The directory information contains, for example, name of a file, file-creation date and time, file-update date and time, attribute, data size, and a start position of data (the file's start cluster). When a single file is stored across a plurality of clusters, the start cluster is specified by the directory information stored in the root directory entry. The next cluster is specified by a cluster identifier stored in a cluster indicated by a cluster number associated with the start cluster in the FAT. Clusters from the cluster immediately following the specified cluster to the last cluster are sequentially specified in the FAT.

The FAT file system manages user data with the above-described configuration. Accordingly, the FAT file system updates a file through the following procedure from (1) to (7).
(1) Delete directory information from the root directory entry.
(2) Delete a cluster(s) from FAT1.
(3) Delete a cluster(s) from FAT2.
(4) Write the file to the user data area.
(5) Add a cluster(s) to FAT2.
(6) Add a cluster(s) to FAT1.
(7) Add directory information to the root directory entry.

As can be seen from the above-described procedure, in the configuration where user data is managed on the FAT file system, management information, such as the FAT and the root directory entry, is more frequently updated than the user data area where user data is actually written. In practice, when data is written to the external memory 160, such as the USB memory 140 and the SD card 150, the controller 110, for example, performs a control operation that causes actual addresses to be distributed. However, such a control operation can be based on various algorithms, and it is difficult for a user to understand how data writing is actually controlled. In some cases, the control operation is performed mainly by swapping with a free block, for example. Accordingly, locations where data is actually written can be unevenly distributed. For this reason, recording per-cluster write counts, which are management information on the FAT file system, is information effective for determining end of life of the external memory 160 in a simple manner.

As described earlier, writing and reading data to and from the external memory 160 are performed by the device driver running on the OS. In the second embodiment, a file system driver also runs on the OS to enable file access from an upper-layer application; the file system driver and the device driver cooperate to write and read data to and from the external memory 160.

FIG. 11 is a block diagram illustrating an example functional configuration of a lifetime management device 100B of the second embodiment. The lifetime management device 100B of the second embodiment has a configuration that includes, as illustrated in FIG. 11 for example, a second information recording unit 31, a cluster management unit 32, a second write-inhibit control unit 33, and a second information-write control unit 34 in addition to the elements of the lifetime management device 100A (see FIG. 3) of the first embodiment. These functional elements making up the lifetime management device 100B are implemented by, for example, the CPU 111 of the controller 110 by executing a predetermined program where a procedure for performing a lifetime management method is described as program codes as in the case of the above-described first embodiment.

The second information recording unit 31 is a functional module that associates per-cluster write counts managed on the FAT file system with usage-start date and time of the external memory 160 into an associated set and records the associated set in the DRAM 112, which is a volatile internal memory. The information of the per-cluster write counts recorded in the form associated with the usage-start date and time of the external memory 160 is hereinafter referred to as "write-count management information".

At power-on of the image forming apparatus 100, the second information recording unit 31 determines whether or not the write-count management information is stored in the external memory 160 connected to the image forming apparatus 100. When the write-count management information is stored in the external memory 160, the second information recording unit 31 reads out the write-count management information from the external memory 160 and copies the write-count management information to the DRAM 112. Thereafter, each time data is written to the external memory 160, the second information recording unit 31 counts per-cluster write counts and updates the write-count management information in the DRAM 112. On the other hand, when, as in a case where the external memory 160 is newly connected to the image forming apparatus 100, the write-count management information is not stored in the external memory 160, the second information recording unit 31 records current time, for example, as usage-start date and time of the external memory 160 in the DRAM 112. Thereafter, each time data is written to the external memory 160, the second information recording unit 31 counts per-cluster write counts and records the per-cluster write counts in the DRAM 112.

Figure 12:
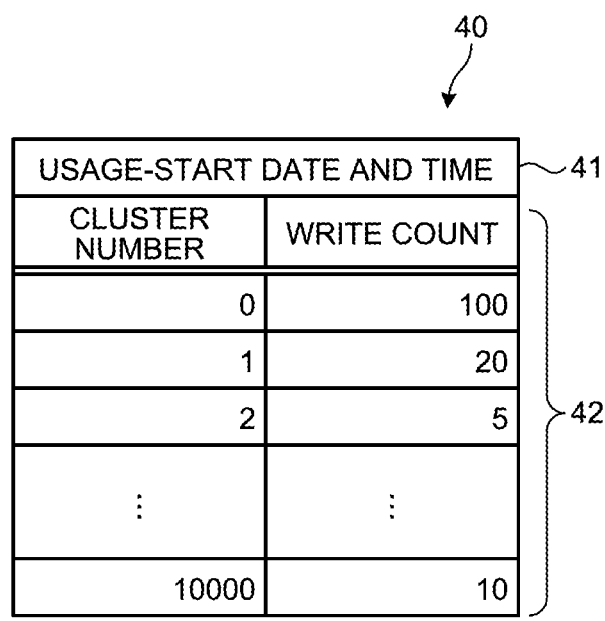
FIG. 12 is a diagram illustrating an example of write-count management information.

FIG. 12 is a diagram illustrating an example of write-count management information 40. As illustrated in FIG. 12, the write-count management information 40 is configured by associating information 41 that indicates usage-start date and time of the external memory 160 with information 42 that indicates per-cluster write counts. Clusters, to which user data is to be actually written, are the clusters whose cluster numbers are equal to or larger than "2" in the FAT. Accordingly, by allocating, for convenience, the cluster number "0" and the cluster number "1" for management information, such as a FAT and the root directory entry, it is possible to record write counts as per-cluster write counts even when the management information is updated.

The cluster management unit 32 is a functional module that marks each cluster whose write count in the write-count management information 40 recorded by the second information recording unit 31 in the DRAM 112 has reached the predetermined count or, in other words, each cluster in the external memory 160 whose write count has reached the predetermined count, as a bad cluster. This process to be performed by the cluster management unit 32 can be implemented by, for example, storing a cluster identifier indicating a bad cluster in a cluster corresponding to the cluster whose write count has reached the predetermined count in the FAT.

The second write-inhibit control unit 33 is a functional module that performs a control operation that inhibits writing data to the external memory 160 where the number of bad clusters has exceeded the predetermined number. The second write-inhibit control unit 33 can inhibit writing data to the external memory 160 by, for example, counting the number of bad clusters by accessing the FAT and, when the number of the bad clusters has exceeded the predetermined number, placing the external memory 160 in the write inhibit mode. Placing the external memory 160 in the write inhibit mode may be implemented by turning on a specific switch provided on the external memory 160 or, alternatively, by setting a specific flag determined in advance. The control operation that inhibits writing data to the external memory 160 may be performed by setting the device driver associated with the external memory 160 in a write inhibit mode.

The second information-write control unit 34 is a functional module that performs a control operation that causes the write-count management information 40 recorded in the DRAM 112, which is a volatile internal memory, to be written to the external memory 160 when power supply to the image forming apparatus 100 is cut off. Each time power supply to the image forming apparatus 100 is cut off, the second information-write control unit 34 thus performs the control operation that causes the write-count management information 40 in the DRAM 112 to be written to the external memory 160, thereby synchronizing the write-count management information 40 between the image forming apparatus 100 and the external memory 160. The second information-write control unit 34 may be configured to perform the control operation that causes the write-count management information 40 recorded in the DRAM 112 to be written to the external memory 160 not only when power supply to the image forming apparatus 100 is cut off but also at transition of the image forming apparatus 100 to an energy-saving operation mode. With this configuration, frequency of data synchronization can be increased.

Figure 13:
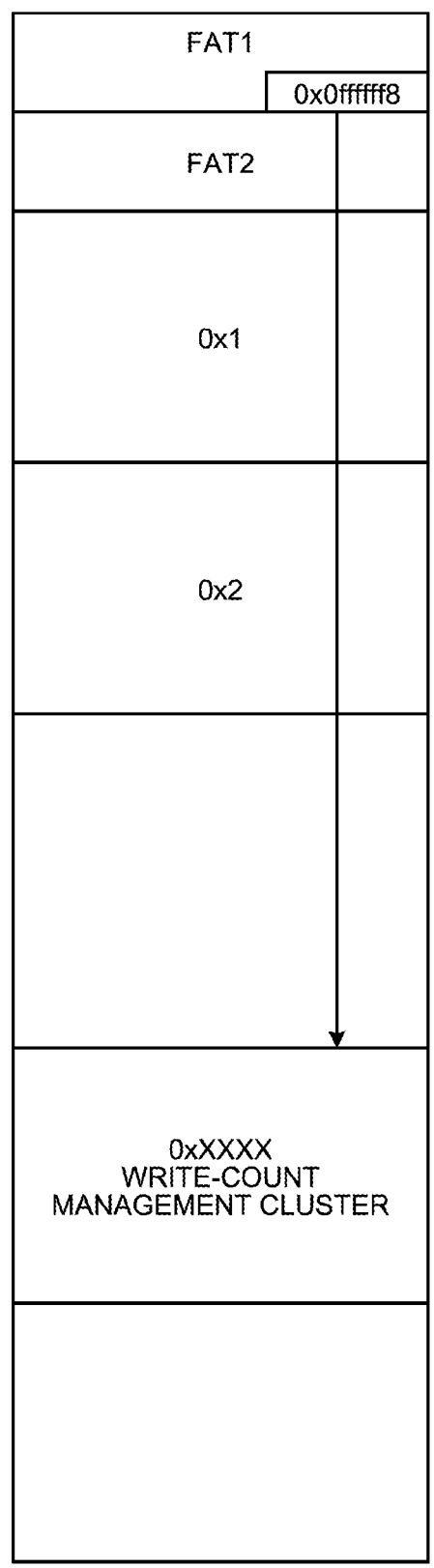
FIG. 13 is a diagram describing an example of a method of writing the write-count management information to the external memory.

FIG. 13 is a diagram describing an example of a method of writing the write-count management information 40 to the external memory 160. When the external memory 160 is connected to the image forming apparatus 100, as illustrated in FIG. 13, a special flag is set for a cluster number corresponding to a predetermined free cluster (in this example, 0x0fffff8, by which the last cluster is to be identified, is to be used) in the FAT, thereby setting this cluster as a write-count management cluster and preventing use of this cluster for the other purpose. When the write-count management information 40 is to be written to the external memory 160, the write-count management information 40, an example of which is illustrated in FIG. 12, is written to the write-count management cluster in the user data area pointed by the cluster number, for which the above-described flag is set in the FAT.

In the lifetime management device 100B of the second embodiment, as in the lifetime management device 100A of the first embodiment, the end-of-life prediction unit 14 can predict end-of-life date and time when a cumulative written amount of the external memory 160 will reach the predetermined amount based on the cumulative written amount and usage-start date and time of the external memory 160 recorded in the NVRAM 115. Furthermore, the end-of-life prediction unit 14 can predict end-of-life date and time when a total write count of the external memory 160 will reach its upper-limit count based on the write-count management information 40 recorded in the DRAM 112.

Prediction of end-of-life date and time when the total write count of the external memory 160 will reach the predetermined count is made as follows. When the time for predicting end-of-life date and time comes, the end-of-life prediction unit 14 accesses the write-count management information 40 recorded in the DRAM 112 to calculate elapsed time since when use of the external memory 160 is started based on usage-start date and time of the external memory 160 and current time first. The end-of-life prediction unit 14 calculates an average write count per unit time (e.g., per hour) of the external memory 160 by dividing a sum total of the per-cluster write counts (total write count) contained in the write-count management information 40 by the elapsed time. Next, the end-of-life prediction unit 14 predicts end-of-life date and time when the total write count of the external memory 160 will reach the upper limit count by dividing the difference between the sum total of the per-cluster write counts and the predetermined count by the average write count per unit time.

Next, operations of the lifetime management device 100B of the second embodiment that differ from the operations of the lifetime management device 100A of the first embodiment are described below with reference to FIG. 14 to FIG. 17.

Figure 14:
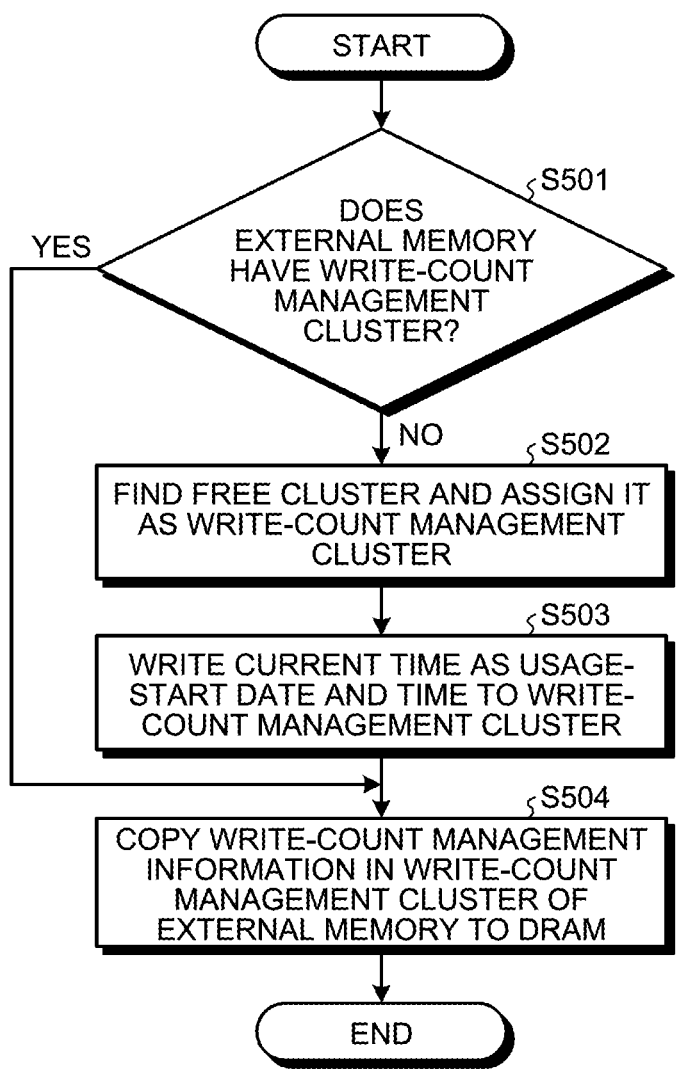
FIG. 14 is a flowchart illustrating an example of how the lifetime management device operates when the external memory is connected to the image forming apparatus.

FIG. 14 is a flowchart illustrating an example of how the lifetime management device 100B operates when the external memory 160 is connected to the image forming apparatus 100. The series of steps illustrated in the flowchart of FIG. 14 is executed each time it is detected that the external memory 160 is connected to the image forming apparatus 100.

When it is detected that the external memory 160 is connected to the image forming apparatus 100, the second information-write control unit 34 determines whether or not the external memory 160 has the write-count management cluster (step S501). When the external memory 160 does not have the write-count management cluster (No at step S501), the second information-write control unit 34 finds a free cluster using the FAT of the external memory 160 and assigns the free cluster as the write-count management cluster (step S502). Next, the second information-write control unit 34 writes current time as usage-start date and time to the write-count management cluster of the external memory 160 assigned at step S502 (step S503). This information is initial information of the write-count management information 40.

Thereafter, the second information-write control unit 34 copies the write-count management information 40 in the write-count management cluster of the external memory 160 to the DRAM 112 (step S504). Then, the series of steps ends. When it is determined that the external memory 160 has the write-count management cluster at step S501 (Yes at step S501), the second information-write control unit 34 copies the write-count management information 40 in the write-count management cluster to the DRAM 112 (step S504). Then, the series of steps ends.

Figure 15:
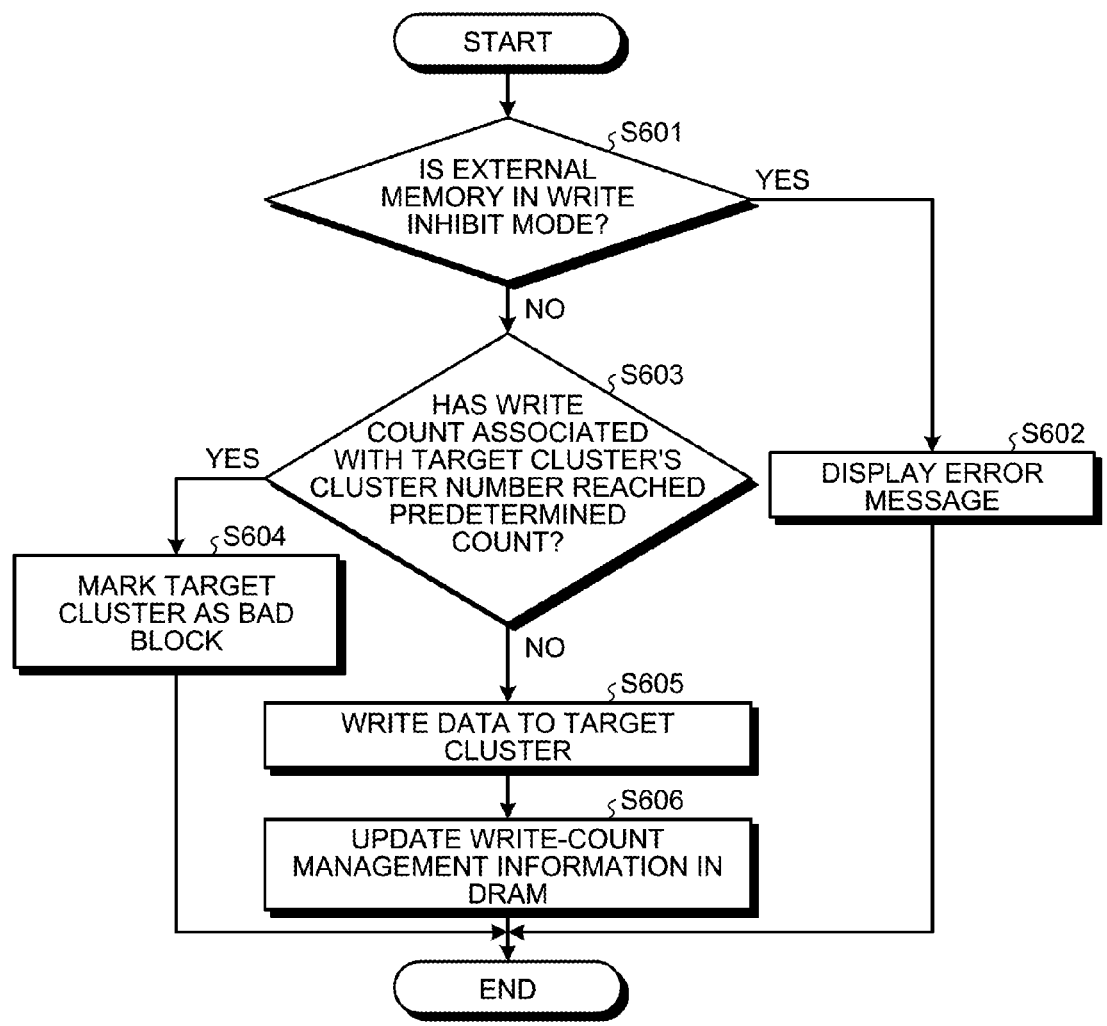
FIG. 15 is a flowchart illustrating an example of how the lifetime management device operates when data is written to the external memory.

FIG. 15 is a flowchart illustrating an example of how the lifetime management device 100B operates when data is written to the external memory 160. The series of steps illustrated in the flowchart of FIG. 15 is executed each time the device driver operating in the write management mode receives a write command.

When the device driver associated with the external memory 160 receives a write command, the display control unit 15 determines whether or not the external memory 160 is in the write inhibit mode first (step S601). When the external memory 160 is in the write inhibit mode (Yes at step S601), the display control unit 15 causes an error message indicating that the external memory 160 is unavailable or the like to be displayed on the operation panel 120 (step S602). Then, the series of steps ends.

On the other hand, when the external memory 160 is not in the write inhibit mode (No at step S601), the cluster management unit 32 accesses the write-count management information 40 recorded in the DRAM 112 to determine whether or not a write count associated with a cluster number pointing a cluster where data is to be written (hereinafter, "target cluster's cluster number") has reached the predetermined count (step S603). When the write count associated with the target cluster's cluster number has reached the predetermined count (Yes at step S603), the cluster management unit 32 marks the target cluster of the external memory 160 as a bad cluster (step S604). Then, the series of steps ends.

On the other hand, when the write count associated with the target cluster's cluster number has not reached the predetermined count (No at step S603), the device driver writes data to the target cluster (step S605). The second information recording unit 31 updates the write-count management information 40 in the DRAM 112 in a manner to increase the write count for the target cluster (step S606). Then, the series of steps ends.

Figure 16:
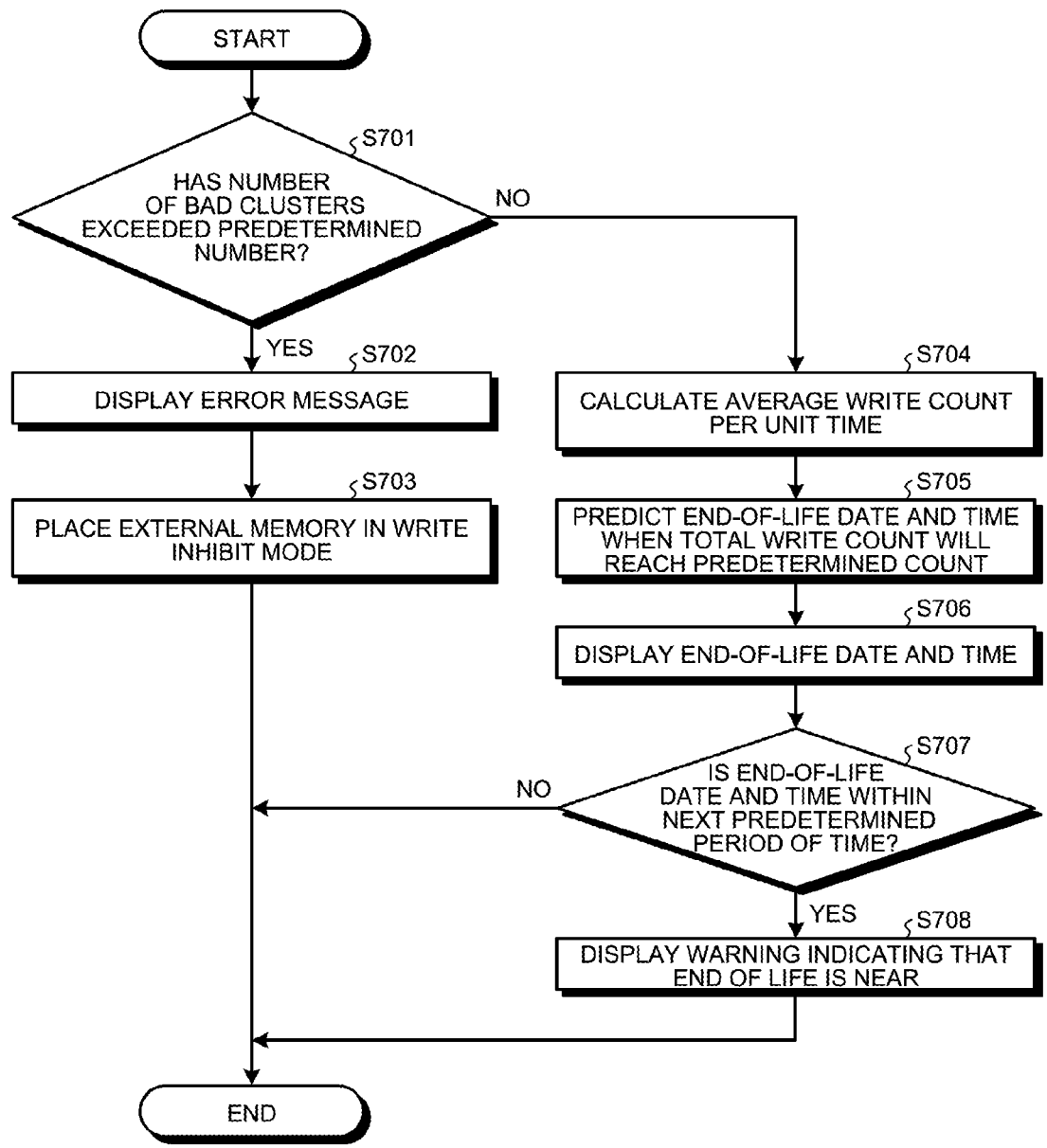
FIG. 16 is a flowchart illustrating an example of how the lifetime management device operates when the time for predicting end-of-life date and time comes.

FIG. 16 is a flowchart illustrating an example of how the lifetime management device 100B operates when the time for predicting end-of-life date and time comes. The series of steps illustrated in the flowchart of FIG. 16 is executed each time when the specific time determined in advance as the time for predicting end-of-life date and time comes.

When the time for predicting end-of-life date and time comes, whether or not the number of bad clusters has exceeded the predetermined number is determined using the FAT of the external memory 160 connected to the image forming apparatus 100 (step S701). When the number of bad clusters has exceeded the predetermined number (Yes at step S701), the display control unit 15 causes an error message indicating that the external memory 160 is unavailable or the like to be displayed on the operation panel 120 (step S702). The second write-inhibit control unit 33 places the external memory 160 in the write inhibit mode (step S703). Then, the series of steps ends.

On the other hand, when the number of the bad clusters has not exceeded the predetermined number (No at step S701), the end-of-life prediction unit 14 accesses the write-count management information 40 in the DRAM 112 to calculate an average write count per unit time of the external memory 160 based on usage-start date and time of the external memory 160, current time, and a total write count (a sum total of per-cluster write counts) of the external memory 160 (step S704). The end-of-life prediction unit 14 predicts end-of-life date and time when the total write count of the external memory 160 will reach the upper-limit count by dividing the difference between the total write count and the upper-limit count by the average write count per unit time calculated at step S704 (step S705).

Next, the display control unit 15 causes the end-of-life date and time of the external memory 160 predicted at step S705 to be displayed on the operation panel 120 (step S706). The display control unit 15 determines whether or not the end-of-life date and time of the external memory 160 predicted at step S705 is within the next predetermined period of time (e.g., within the next three months) (step S707). When the end-of-life date and time of the external memory 160 is within the next predetermined period of time (Yes at step S707), the display control unit 15 causes the warning message indicating that end of life of the external memory 160 is near to be displayed on the operation panel 120 (step S708). Then, the series of steps ends. When the end-of-life date and time of the external memory 160 is not within the next predetermined period of time (No at step S707), only displaying the end-of-life date and time of step S706 is performed.

Figure 17:
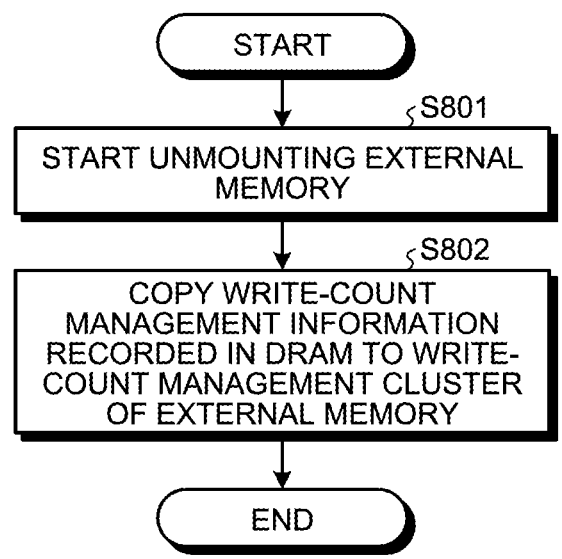
FIG. 17 is a flowchart illustrating an example of how the lifetime management device operates when power supply to the image forming apparatus is cut off.

FIG. 17 is a flowchart illustrating an example of how the lifetime management device 100B operates when power supply to the image forming apparatus 100 is cut off. The series of steps illustrated in the flowchart of FIG. 17 is executed each time power supply to the image forming apparatus 100 is cut off.

When an operation that cuts off power supply to the image forming apparatus 100 is performed, first, the device driver starts unmounting the external memory 160 (step S801). Thereafter, the second information-write control unit 34 copies the write-count management information 40 recorded in the DRAM 112 to the write-count management cluster of the external memory 160 (step S802), thereby synchronizing the write-count management information 40 between the image forming apparatus 100 and the external memory 160. Then, the series of steps ends.

As described above in detail through specific examples, the lifetime management device 100B of the second embodiment is configured such that the second information recording unit 31 associates per-cluster write counts of the external memory 160 with usage-start date and time of the external memory 160 into an associated set and records the associated set, i.e., the write-count management information 40, in the DRAM 112. The cluster management unit 32 marks each cluster whose write count has reached the predetermined count as a bad cluster. When the number of bad clusters has exceeded the predetermined number, the second write-inhibit control unit 33 determines that the external memory 160 has reached its end of life, and performs the control operation that inhibits writing data to the external memory 160. Accordingly, the lifetime management device 100B of the second embodiment can determine end of life of the external memory 160 accurately even when data is written to a specific cluster in a concentrated manner. Hence, the lifetime management device 100B can effectively reduce occurrence of an undesirable situation that writing data to the external memory 160 that has reached its end of life results in loss of existing data stored in the external memory 160.

Furthermore, the lifetime management device 100B of the second embodiment is configured such that the end-of-life prediction unit 14 can predict end-of-life date and time of the external memory 160 or, more specifically, end-of-life date and time when the total write count of the external memory 160 will reach the upper-limit count, based on the write-count management information 40 recorded in the DRAM 112. Accordingly, lifetime of the external memory 160 can be managed appropriately.

The lifetime management device 100B of the second embodiment is configured such that, when power supply to the image forming apparatus 100 is cut off, the second information-write control unit 34 performs the control operation that writes the write-count management information 40 recorded in the DRAM 112 to the external memory 160. Accordingly, the per-cluster write counts of the external memory 160 can be managed appropriately by synchronizing the write-count management information 40 between the image forming apparatus 100 and the external memory 160.

In the above-described example, the write-count management information 40 is recorded in the DRAM 112, which is a volatile internal memory arranged in the controller 110 of the image forming apparatus 100. Alternatively, the lifetime management device 100B of the second embodiment may be configured such that the write-count management information 40 is recorded in a non-volatile memory, such as the NVRAM 115, provided in the controller 110 of the image forming apparatus 100 or an HDD (Hard Disk Drive) connected to the controller 110. With this configuration, an undesirable situation that the write-count management information 40 is lost by an unexpected power-off (in the event of a power failure, for example) of the image forming apparatus 100 can be effectively prevented.

According to an aspect of the present invention, lifetime of a first storage device can be managed appropriately.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

Further, any of the above-described apparatus, devices or units can be implemented as a hardware apparatus, such as a special-purpose circuit or device, or as a hardware/software combination, such as a processor executing a software program.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, non-volatile memory, semiconductor memory, read-only-memory (ROM), etc.

Alternatively, any one of the above-described and other methods of the present invention may be implemented by an application specific integrated circuit (ASIC), a digital signal processor (DSP) or a field programmable gate array (FPGA), prepared by interconnecting an appropriate network of conventional component circuits or by a combination thereof with one or more conventional general purpose microprocessors or signal processors programmed accordingly.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. A lifetime management device configured to predict an end-of-life date and time of a first storage device connected to an equipment, the lifetime management device comprising:
   a memory and a processor, the memory containing computer readable code that, when executed by the processor, configures the processor to,
   calculate, each time data is written to the first storage device, a cumulative written amount, the cumulative written amount being a sum of amounts of data written to the first storage device,
   detect identification information and usage-start date and time, the identification information identifying the first storage device and the usage-start date and time being detected based on a time the first storage device was connected to the equipment,
   associate the cumulative written amount with the identification information of the first storage device and the usage-start date and time of the first storage device into a first associated set,
   record the first associated set in a second storage device, and
   predict the end-of-life date and time of the first storage device based on the cumulative written amount and the usage-start date and time recorded in the second storage device.

2. The lifetime management device according to claim 1, wherein the processor is further configured to,
   read out the identification information, when the first storage device is connected to the equipment and the first storage device holds the identification information, and
   generate the identification information and write the identification information to the first storage device, when the first storage device is connected to the equipment and the first storage device does not hold the identification information.

3. The lifetime management device according to claim 1, wherein the processor is further configured to,
   inhibit writing data to the first storage device whose cumulative written amount has reached a set amount, and
   suspend incrementing the cumulative written amount of the data written to the first storage device, when the processor inhibits writing the data to the first storage device.

4. The lifetime management device according to claim 1, wherein the processor is further configured to,
   write the cumulative written amount and the usage-start date and time recorded in the second storage device to the first storage device in response to a set operation.

5. The lifetime management device according to claim 1, wherein the processor is further configured to,
   display the end-of-life date and time on a display device.

6. The lifetime management device according to claim 1, wherein the processor is further: configured to,
   associate per-cluster write counts managed on a file system, the file system being provided for the first storage device, with the usage-start date and time of the first storage device into a second associated set, record the second associated set in a third storage device, mark clusters whose write count recorded in the third storage device has reached a set count as bad clusters, and inhibit writing of data to the first storage device where a number of the bad clusters has exceeded a threshold number.

7. The lifetime management device according to claim 6, wherein the processor is configured to, predict the end-of-life date and time of the first storage device based on the cumulative written amount and the usage-start date and time recorded in the second storage device, or based on a sum total of the per-cluster write counts and the usage-start date and time recorded in the second storage device.

8. The lifetime management device according to claim 6, wherein the first storage device is a flash memory externally connected to the equipment, and the third storage device is a volatile memory mounted on the equipment.

9. The lifetime management device according to claim 8, wherein the processor is further configured to, write the per-cluster write counts recorded in the third storage device to the first storage device when power supply to the equipment is cut off or at transition of the equipment to an energy-saving operation mode.

10. The lifetime management device according to claim 6, wherein the first storage device is a flash memory externally connected to the equipment, and the third storage device is a non-volatile memory mounted on the equipment and having virtually unlimited program/erase cycle endurance.

11. The lifetime management device according to claim 1, wherein the processor further configured to, calculate an average written amount per unit time of the first storage device based on the usage-start date and time of the first storage device, current time, and the cumulative written amount, and predict the end-of-life date and time when the cumulative written amount of the first storage device will reach a set amount by dividing a difference between the cumulative written amount and the set amount by the average written amount per unit time.

12. A lifetime management method of predicting an end-of-life date and time of a first storage device connected to an equipment, the method comprising:

calculating, each time data is written to the first storage device, a cumulative written amount, the cumulative written amount being a sum of amounts of data written to the first storage device;

detecting identification information and usage-start date and time, the identification information identifying the first storage device and the usage-start date and time being detected based on a time the first storage device was connected to the equipment;

associating the cumulative written amount with the identification information of the first storage device and the usage-start date and time of the first storage device into a first associated set;

recording the first associated set in a second storage device; and predicting the end-of-life date and time of the first storage device based on the cumulative written amount and the usage-start date and time recorded in the second storage device.

13. The lifetime management method according to claim 12, further comprising:

reading out the identification information, when the first storage device holds the identification information, and generating the identification information and writing the identification information to the first storage device, when the first storage device does not hold the identification information.

14. The lifetime management method according to claim 12, further comprising:

inhibiting writing data to the first storage device whose cumulative written amount has reached a set amount.

15. The lifetime management method according to claim 12, further comprising:

writing the cumulative written amount and the usage-start date and time recorded in the second storage device to the first storage device in response to a set operation.

16. The lifetime management method according to claim 12, further comprising:

displaying the end-of-life date and time on a display device.

17. The lifetime management method according to claim 12, further comprising:

associating per-cluster write counts managed on a file system, the file system being provided for the first storage device, with the usage-start date and time of the first storage device into a second associated set;

recording the second associated set in a third storage device;

marking clusters whose write count recorded in the third storage device has reached a set count as bad clusters; and inhibiting writing of data to the first storage device where a number of the bad clusters has exceeded a threshold number.

18. The lifetime management method according to claim 17, wherein the predicting predicts the end-of-life date and time of the first storage device based on the cumulative written amount and the usage-start date and time recorded in the second storage device, or based on a sum total of the per-cluster write counts and the usage-start date and time recorded in the second storage device.

19. The lifetime management method to claim 12, further comprising:

calculating an average written amount per unit time of the first storage device based on the usage-start date and time of the first storage device, current time, and the cumulative written amount, and wherein the predicting predicts the end-of-life date and time when the cumulative written amount of the first storage device will reach a set amount by dividing a difference between the cumulative written amount and the set amount by the average written amount per unit time.

20. A lifetime management device comprising:

a memory and a processor, the memory containing computer readable code that, when executed by the processor, configures the processor to, calculate, each time data is written to a first storage device, a cumulative written amount, the cumulative written amount being a sum of amounts of data written to the first storage device, associate the cumulative written amount with identification information of the first storage device and usage-start date and time of the first storage device into a first associated set, record the first associated set in a second storage device, associate per-cluster write counts managed on a file system, the file system being provided for the first storage device, with the usage-start date and time of the first storage device into a second associated set, record the second associated set in a third storage device, mark clusters whose write count recorded in the third storage device has reached a set count as bad clusters, inhibit writing of data to the first storage device where a number of the bad clusters has exceeded a threshold number, and predict end-of-life date and time of the first storage device based on one or more of (i) the cumulative written amount and the usage-start date and time recorded in the second storage device and (ii) a sum total of the per-cluster write counts and the usage-start date and time recorded in the second storage device.

* * * * *